United States Patent [19]

Chemelewski

[11] Patent Number: 4,688,265

[45] Date of Patent: Aug. 18, 1987

[54] DYNAMIC NOISE BLANKER CIRCUIT

[75] Inventor: Gary Chemelewski, N. Richland Hills, Tex.

[73] Assignee: Motorola, Inc., Schaumburg, Ill.

[21] Appl. No.: 882,643

[22] Filed: Jul. 7, 1986

[51] Int. Cl.$^4$ .............................................. H04B 1/10
[52] U.S. Cl. ................................... 455/223; 455/311
[58] Field of Search ...................... 455/212, 218–220, 455/222–225, 296, 311, 312; 375/104

[56] References Cited

U.S. PATENT DOCUMENTS

| | | | |
|---|---|---|---|
| 3,241,073 | 3/1966 | Hummel. | |
| 3,284,714 | 11/1966 | Battin et al. | |
| 3,304,503 | 2/1967 | Walker et al. | |
| 3,350,646 | 10/1967 | Graziano et al. | |
| 3,462,691 | 8/1969 | McDonald. | |
| 3,544,904 | 12/1970 | Eness. | |
| 3,623,144 | 11/1971 | Fischel et al. | |
| 3,699,457 | 10/1972 | Wright. | |
| 3,725,674 | 4/1973 | Schaefer et al. | 307/237 |
| 4,143,325 | 3/1979 | Kahn | 455/222 |
| 4,334,317 | 6/1982 | Beesley | 455/194 |
| 4,335,322 | 6/1982 | Tanaka et al. | 307/542 |
| 4,388,731 | 6/1983 | King | 455/222 |
| 4,466,129 | 8/1984 | Skutta | 455/219 |
| 4,510,624 | 4/1985 | Thompson et al. | 455/223 |

*Primary Examiner*—Jin F. Ng
*Attorney, Agent, or Firm*—Margaret Marsh Parker

[57] ABSTRACT

An FM receiver as used in communciations systems includes a blanking switch for deleting noise pulses and a delay device for delaying the detected pulses so that blanking can occur at the correct time. The circuit receives and detects noise pulses and amplifies them at several gain levels simultaneously. Each amplified pulse which passes a predetermined level causes a trigger signal pulse to be coupled to a ramp generator. The trigger signal pulses are coupled through a combination of flip-flops and voltage controlled switches, and each noise pulse enables a ramp signal of a predetermined maximum but having a rise time which is a function of the detected noise pulse amplitude. The ramp signal length is used to provide blanking switch control signals of an appropriate length to blank out substantially all significant noise pulses.

11 Claims, 4 Drawing Figures

DYNAMIC NOISE BLANKER CIRCUIT

BACKGROUND OF THE INVENTION

This invention relates to the field of two-way radio communications and, more particularly, to an improvement in the noise blanking circuit of a receiver for such a system.

In general, blanking circuits detect noise signals added to an information-bearing carrier signal during transmission and reduce the noise perceived by the user of the receiver by, in some manner, preventing any signal from being outputted by the receiver when the received noise is excessive. In other words, a blanking circuit "clips out" tiny bits of the output when a noise pulse would otherwise be heard.

Many circuit designs have placed the blanking function in various parts of the receiver in an attempt to optimize the output signal. The problem in designing blanking circuits arises from the necessary compromise between eliminating all of the noise and, at the same time, causing no degradation in the information signal. Even relatively early patents in this field refer to the problem that occurs when a receiver's signal is blanked for too much of the time. If the signal path is interrupted for a very short period, the "hole" in the signal is filled in by stored energy and is unnoticed, but if there are too many holes, or each hole is over-extended, there will not be enough stored energy to fill in all of the holes, and noise will fill them. Partial solutions for this problem include "rate shutoff" circuits which limit the blanking action at high noise impulse rates. This is done by changing the width and amplitude of the blanking pulses when the blanking pulses exceed a given repetition rate for a predetermined length of time. Another solution is the inclusion of a level sensing circuit which decreases the sensitivity of the blanker circuit to received impulse noise in response to the received signal.

With the recent addition of surface acoustic wave (SAW) filters for delaying the received signal to allow time for the blanking circuit to blank out the noise, a new problem has arisen. A signal injected into a SAW filter does not simply exit intact at the other end at a slightly later time, but some of the energy is reflected back and forth to exit as an echo or multiple echoes. This, in effect, lengthens the received noise pulse in addition to the lengthening in the front end stages of the receiver. The more energy there is in a noise pulse, the more echoes will be apparent. This means that a high energy pulse will require a longer blanking period than a low energy pulse. As stated above, it is still desirable to use blanking pulses which are as short as possible and still blank out the noise satisfactorily.

SUMMARY OF THE INVENTION

An object of the invention is to provide improved blanking of noise pulses in a communications receiver.

A more particular object is to provide blanking pulses which are related in length to the amount of energy in each noise pulse.

These objects and others are achieved in a circuit according to the present invention wherein, in addition to the usual stages of an FM receiver, a SAW filter delays the progress of the received signals enough to make blanking possible. An AM receiver is also connected to receive the same signal and demodulate the amplitude variations caused by noise added to the FM signal during transmission. These detected variations are coupled to two or more amplifiers, each having a different amount of gain. The amplifier outputs are shaped into trigger pulses which are combined to produce a ramp whose length is a function of the amplitude of the original noise pulse. The ramp signal is threshold detected and, in combination with the output of the amplifier having the highest gain, produces a rectangular pulse whose length is a function of the noise pulse amplitude and which is used to enable a blanking switch in the FM receiver.

DETAILED DESCRIPTION OF THE PREFERRED EMBODIMENT

Figure 1:
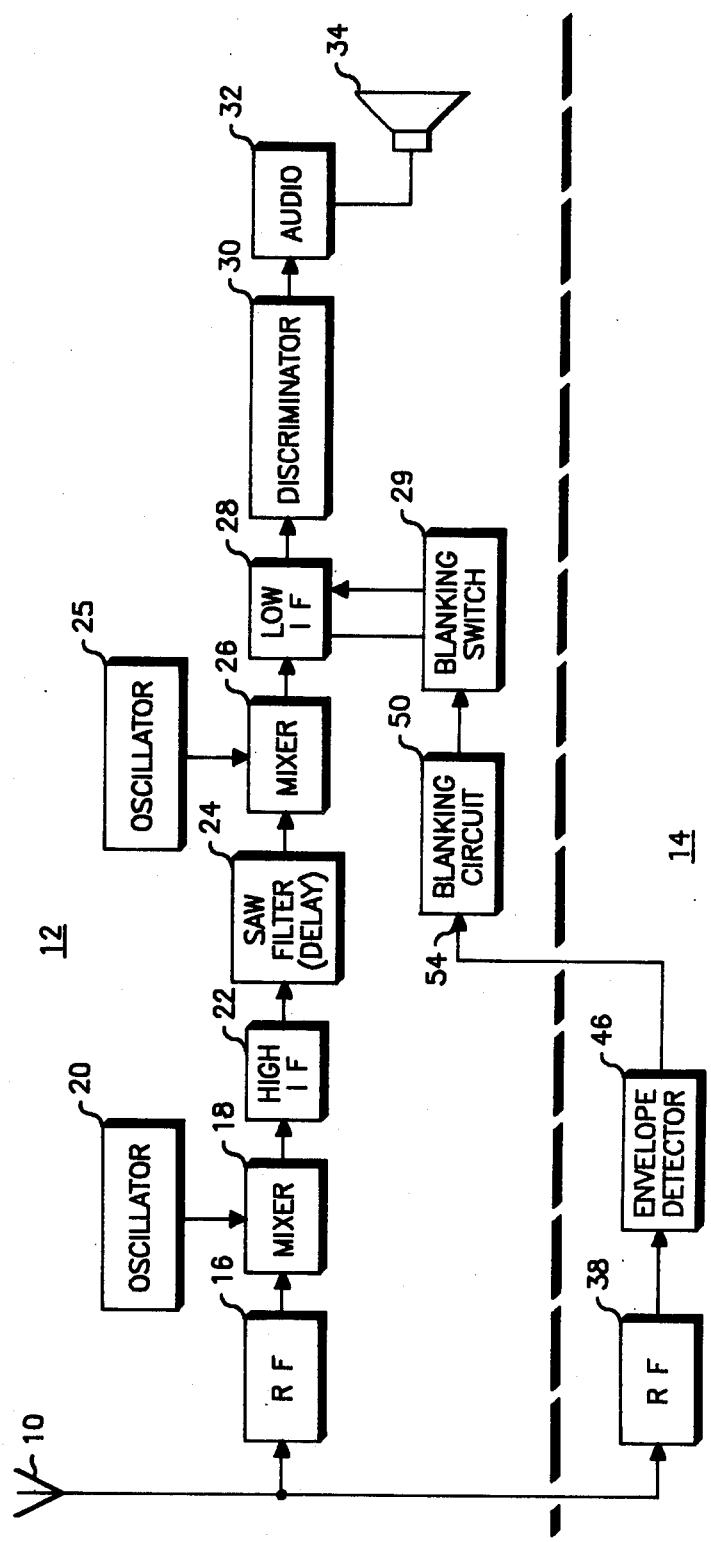
FIG. 1 is a block diagram of a receiver including the invention.

FIG. 1 shows a generalized view of a complete communications receiver such as might use the blanking circuit of the invention. The invention was designed for but is not limited to receivers operating at frequencies up to 100 MHz. Other frequencies and other receiver configurations might well be used also.

At an antenna 10, an FM signal is received which may include noise pulses added during the transmission process. Coupled to the antenna 10, which may be one antenna or separate antennas, are an FM receiver 12 and an AM receiver 14. The FM receiver 12 includes an RF stage 16, a mixer 18 and an oscillator 20 which provide a signal output at a first intermediate frequency to a high IF stage 22. The high IF signal is delayed in a SAW filter 24 and coupled to a second IF circuit including an oscillator 25, mixer stage 26, and lower frequency, narrow band IF stage 28. The lower frequency IF signal is coupled through a blanking switch 29 to a discriminator circuit 30. It will be apparent that the blanking circuit of this invention could as well be used in receivers having almost any front end configuration and that the particular position of the blanking switch shown is not a requirement of the invention. Theoretically, blanking can be done anywhere from the RF on down, but there are great advantages in using the SAW filter 24 at a fixed frequency. It is also preferable to have the blanking switch ahead of the narrowband IF stage. The audio output of the discriminator 30 is coupled through an audio stage 32 to a speaker 34 or other output device.

In the AM receiver portion 14, the received FM signal is coupled through a tuned RF stage 38 to an envelope detector 46, the output of which is essentially the noise impulses added by the transmission process. It is these noise impulses which are coupled to a blanking circuit 50 for providing the blanking pulses to the blanking switch 26.

Figure 2:
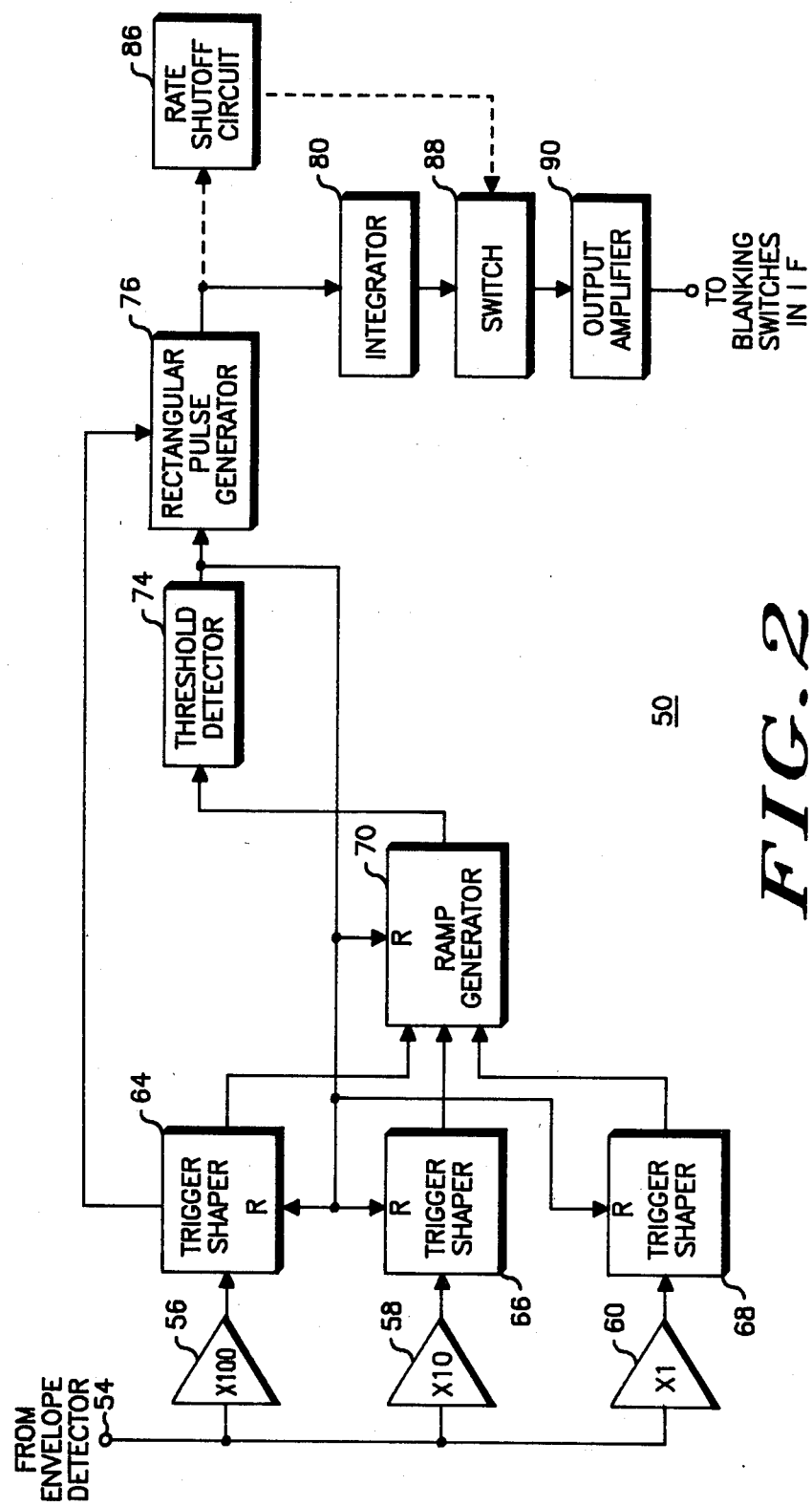
FIG. 2 is a block diagram of the blanking circuit of the invention.
Figure 3:
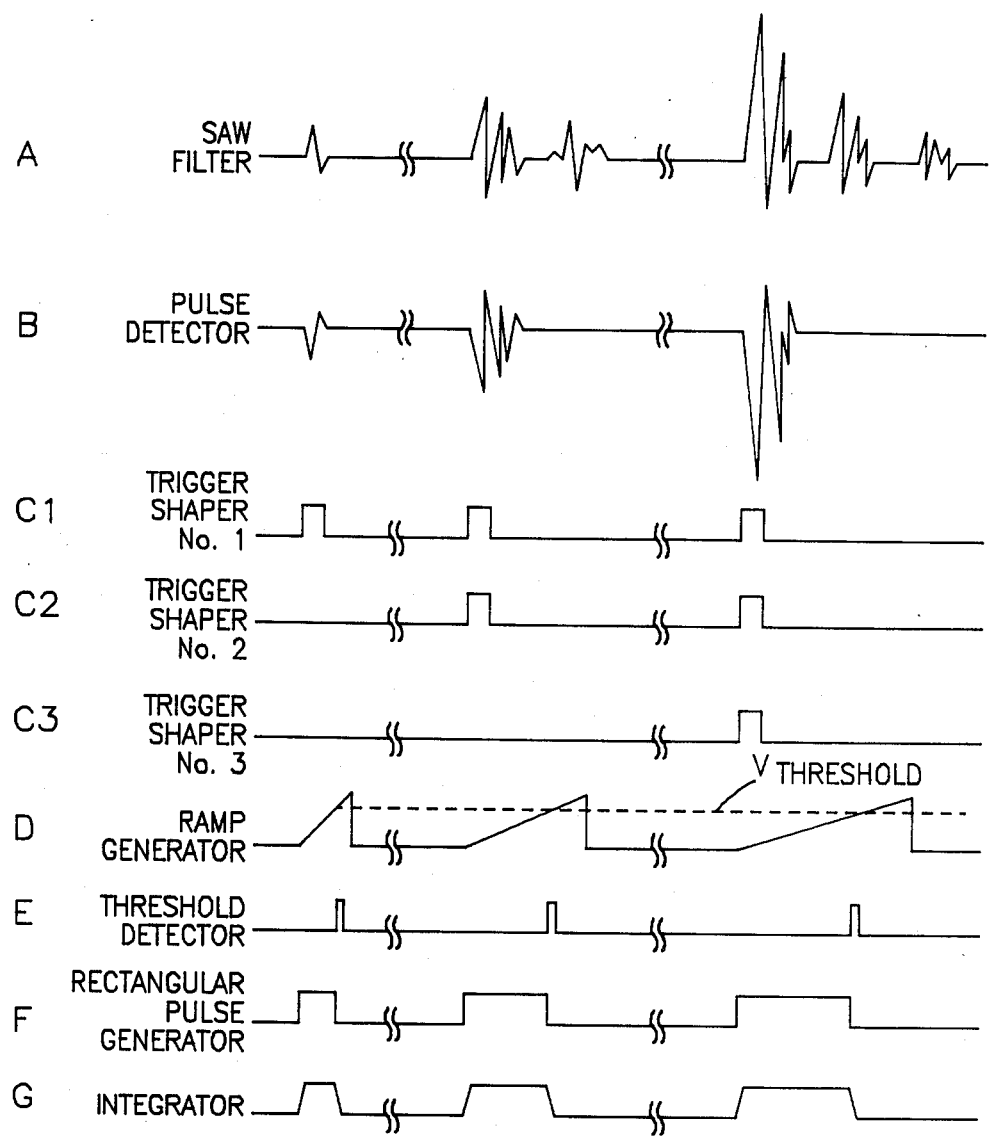
FIG. 3 is a chart of waveforms related to the diagram of FIG. 2.

FIGS. 2 and 3 are the block diagram of the blanking circuit 50 of FIG. 1, and a chart of the associated waveforms. FIG. 3 is divided vertically into three portions, depicting small, medium and large noise pulses, respectively. Line A is a representation of the three noise pulses as they would exit the SAW filter 24, the medium sized pulse having one significant echo, and the large one having two echoes. There could, of course, be more echoes from larger noise impulses. An input terminal 54 couples the received and detected noise pulses from the envelope detector 46 of FIG. 1. Line B shows the three pulses as detected. The signal at the terminal 54 is coupled to the inputs of each of three amplifiers 56,58,60; amplifier 56 having a gain of 100, amplifier 58 having a gain of 10, and amplifier 60 having a gain of 1. The gain values of these three amplifiers are only exemplary, the actual values in any realization being a function of the SAW filter.

Figure 4:
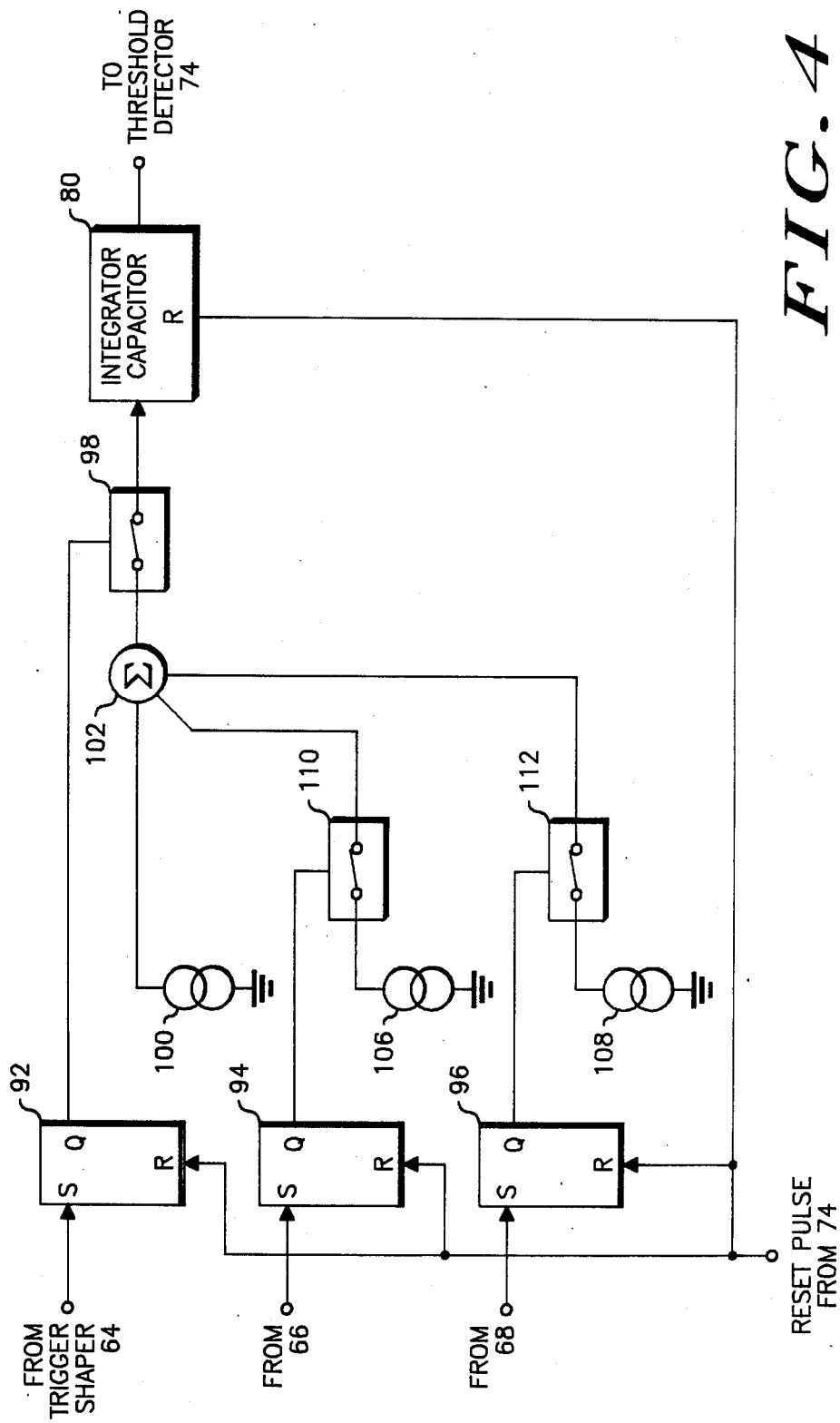
FIG. 4 is a logic/schematic diagram of a ramp generator embodiment.

Each of the three amplifiers 56,58,60, is coupled to a trigger pulse shaper 64,66,68, respectively. Each trigger shaper produces an output pulse for triggering a ramp generator 70 when the corresponding amplifier output exceeds a predetermined value. Lines C1,C2,C3 represent the outputs of the three trigger shapers with the three different-sized noise pulses and illustrate the fact that only the trigger shaper coupled to the output of the X100 amplifier 56 will have an output for a small noise pulse. A medium sized noise pulse will cause the trigger shapers coupled to both the X100 and X10 amplifiers to output a trigger pulse, and a large noise pulse will cause a trigger pulse to be outputted by all three trigger shapers. The ramp generator 70 includes means for creating a ramp signal for each noise pulse detected, with the maximum value of each ramp a constant, but the length of the ramp a function of the amplitude of the noise pulse, as seen in Line D. One embodiment of a ramp generator is shown in FIG. 4. The ramp generator 70 output is coupled to a threshold detector 74 with the threshold voltage set near the maximum of the ramp signals as described above. The output of the threshold detector 74 is seen in Line E and consists of a short pulse when each ramp signal reaches the threshold voltage. The output signal of the threshold detector 74 is coupled to a rectangular pulse generator 76 as a reset signal; the set pulses coming from the output of the trigger shaper 64. The threshold detector 74 output is also coupled to each of the trigger shapers 64,66,68 as a reset pulse.

The rectangular pulse generator 76 will have output pulses as seen in Line F which are initiated at each pulse from trigger shaper 64 and ended at the time when the corresponding ramp reaches the threshold voltage. Since trigger shaper 64 is coupled to the X100 amplifier 56, it provides an output pulse for every noise pulse large enough to be detected. The rectangular output signals from the pulse generator 76 are preferably coupled to an integrator circuit 80 to provide output pulses corresponding to the output of the pulse generator but with sloping sides, and limited to output truncated triangular (trapezoidal) pulses as seen in Line G. Trapezoidal pulses cause less interference in the subsequent stages than rectangular pulses would. A rate shutoff circuit 86 is shown as an optional feature for this receiver As is known, rate shutoff circuits measure the repetition rate of detected noise pulses without regard to their amplitude and, if the rate exceeds a predetermined value, disconnect the blanking function from the IF signal. A switching circuit 88 operated by the output of rate shutoff circuit 86 could be included if desired. The integrator 80 output is coupled to an output amplifier 90 which is connected to control the blanking switch 26 as seen in FIG. 1.

FIG. 4 is a logic/schematic diagram of one possible embodiment of the ramp generator 70 of FIG. 2, with all voltage-controlled switches shown in their normal, i.e. non-activated position. Each of the trigger shapers 64,66,68 provides a set input to three corresponding bistable circuits (RS flip-flops) 92,94,96, the reset signals coming from the output of the threshold detector 74. Referring back to the first vertical portion of FIG. 3, a small noise impulse will cause only trigger shaper 64 to output a trigger pulse. That pulse will set the FF 92, closing a switch 98 and coupling a current source 100, through an adder 102, to a capacitor in an integrator 104. The integrator circuit is also reset by the threshold detector 74 signal. However, since there is no simultaneous trigger pulse from either of the trigger shapers 66 or 68, two other current sources 106,108 are also coupled to the adder 102 through two normally closed switches 110,112. Thus, with all three current sources supplying charging current, the integrator capacitor 104 charges very quickly past the threshold voltage to a predetermined maximum.

In the second portion of FIG. 3, a medium-sized noise pulse causes trigger pulses to be outputted by trigger shapers 64,66, setting FF's 92,94. Thus, the switch 98 is closed, switch 110 is opened and switch 112 remains closed, with the result that only current sources 100 and 108 are coupled to the capacitor 104. This combination provides a ramp signal which rises to the same maximum as in the previous example, but takes somewhat longer to attain its maximum. In the last portion of FIG. 3, dealing with a relatively large noise pulse, trigger pulses are outputted by all three of the trigger shapers. This sets all three flip-flops 92,94,96, closing switch 98 and opening switches 110,112. This allows only the current source 100 to charge capacitor 104, and provides the longest charging time possible in this embodiment. A three step blanking function is provided which is a particular advantage in the specific application for which the circuit was designed. Other blanking functions could be provided as needed for other applications.

Thus there has been shown and described a blanking circuit for a communications receiver which will provide blanking pulses of appropriate length for blanking noise pulses which have been delayed, and possibly echoed, in a SAW filter delay circuit. Other variations and modifications would be apparent to one skilled in the art, and it is intended to cover all such as fall within the scope of the appended claims.

What is claimed is:

1. A noise blanker circuit for use in a radio receiver and comprising:
   input means for receiving a signal including a carrier modulated with an information signal and intermittent noise pulses;
   pulse detector means for detecting a noise pulse in the received signal;
   circuit means for amplifying the detected pulse at a plurality of amplification levels and providing an output pulse at selected ones of a corresponding plurality of intermediate output terminals, the selection determined by the amplitude of the detected noise pulse;
   ramp generator means coupled to each intermediate terminal for providing a ramped signal with length of ramp a function of the detected noise pulse amplitude;
   a threshold detector for receiving the ramped signal and providing a threshold detect signal when said ramped signal exceeds a predetermined threshold level;

pulse shaping means for receiving said threshold detect signal and providing a switch enabling signal derived from said detect signal and having an enabling period which is a function of said detected noise pulse amplitude.

2. A noise blanker circuit according to claim 1 wherein the input means includes detection means for receiving and detecting the desired audio signals on a carrier signal.

3. A noise blanker circuit according to claim 1 wherein the pulse detector means is an envelope detector.

4. A noise blanker circuit according to claim 1 wherein the circuit means includes a plurality of amplifiers each having a distinct level of gain, and a corresponding plurality of signal shaping circuits coupled to the respective amplifiers.

5. A noise blanker circuit according to claim 4 wherein each said signal shaping circuit provides a trigger pulse for said ramp generator.

6. A noise blanker circuit according to claim 1 wherein the ramp generator means includes capacitor means coupled at the output thereof, and charging circuit means coupled to each circuit means output terminal for charging said capacitor means.

7. A noise blanker circuit according to claim 6 wherein the charging circuit means includes a plurality of charging circuits, each including bistable means, a current source and a voltage controlled switch with control signal supplied by the corresponding bistable means output.

8. A noise blanker circuit according to claim 1 wherein each ramped signal has a predetermined maximum.

9. A noise blanker circuit for use in a radio receiver and comprising:
input means for receiving a signal including a carrier modulated with an information signal and intermittent noise pulses;
pulse detector means for detecting a noise pulse in the received signal;
first circuit means for amplifying the detected pulse at a plurality of amplification levels and providing a control pulse at selected ones of a corresponding plurality of intermediate output terminals, the selection determined by the amplitude of the detected noise pulse;
second circuit means coupled to each intermediate output terminal for providing a switch enabling signal derived from said control pulses and having an enabling period which is a function of said detected noise pulse amplitude.

10. A noise blanker circuit according to claim 9 wherein said second circuit means includes ramp generator means for providing a ramped signal with length of ramp a function of the detected noise pulse amplitude, a threshold detector for receiving the ramped signal and providing a threshold detect signal when said ramped signal exceeds a predetermined threshold level, and pulse shaping means coupled to said threshold detector and to at least one of the intermediate output terminals of said first circuit means to provide said switch enabling signal.

11. A radio receiver for receiving a signal including a carrier modulated with an information signal and intermittent noise pulses and including a blanker circuit, the receiver comprising:
detecting and demodulating means for providing a signal including the information signal and the noise pulses;
pulse detector means for detecting a noise pulse in the received signal;
first circuit means for amplifying the detected pulse at a plurality of amplification levels and providing a control pulse at selected ones of a corresponding plurality of intermediate output terminals, the selection determined by the amplitude of the detected noise pulse;
second circuit means coupled to each intermediate output terminal for providing a switch enabling signal derived from said control pulses and having an enabling period which is a function of said detected noise pulse amplitude; and
means for switching off a portion of the receiver in response to said switch enabling signal.

* * * * *